United States Patent [19]
Yamada et al.

[11] Patent Number: 5,744,016
[45] Date of Patent: Apr. 28, 1998

[54] SPUTTERING APPARATUS

[75] Inventors: Yoshiaki Yamada; Toshiki Shinmura, both of Tokyo, Japan

[73] Assignee: NEC Corporation, Tokyo, Japan

[21] Appl. No.: 782,301

[22] Filed: Jan. 16, 1997

Related U.S. Application Data

[63] Continuation of Ser. No. 543,863, Oct. 19, 1995, abandoned.

[30] Foreign Application Priority Data

Oct. 20, 1994 [JP] Japan ................... 6-279693

[51] Int. Cl.$^6$ .................................... C23C 14/34
[52] U.S. Cl. ................ 204/298.11; 204/298.07; 204/298.09; 204/298.13; 204/298.15; 204/192.12; 204/298.19
[58] Field of Search ................ 204/298.07, 298.09, 204/298.11, 298.15, 298.13, 198.12, 192.12, 298.19

[56] References Cited

U.S. PATENT DOCUMENTS

| | | | |
|---|---|---|---|
| 4,824,544 | 4/1989 | Mikalesen et al. | 204/298.11 |
| 4,933,063 | 6/1990 | Katsura et al. | 204/298.11 |
| 5,131,460 | 7/1992 | Krueger | 204/298.09 |
| 5,135,629 | 8/1992 | Sawada et al. | 204/298.01 |
| 5,202,008 | 4/1993 | Talieh et al. | 204/298.11 |
| 5,403,459 | 4/1995 | Guo | 204/298.11 |
| 5,419,029 | 5/1995 | Raaijmakers | 204/298.11 |
| 5,431,799 | 7/1995 | Mosely et al. | 204/298.11 |

FOREIGN PATENT DOCUMENTS

| | | |
|---|---|---|
| 1116070 | 5/1989 | Japan. |
| 1184276 | 7/1989 | Japan. |

OTHER PUBLICATIONS

G.A. Dixit et al.; "A Reactively Sputtered Coherent TiN Process"; Proceedings of 1993 VLSI Multilevel Interconnection Conference, pp. 433–435. Jun. 1993.

S. Ramaswami et al.; "Single Chamber Implementation of a Coherent Ti/Tin Process for Sub–Half Micron Technologies"; Proceedings of 1993 VLSI Multilevel Interconnection Conference, pp. Jun. 1993.

*Primary Examiner*—R. Bruce Breneman
*Assistant Examiner*—Rodney G. McDonald
*Attorney, Agent, or Firm*—Whitham, Curtis & Whitham

[57] ABSTRACT

A magnetron sputtering electrode 2 is attached to a vacuum chamber 1 to make it retain a Ti target 4 via a back plate 3. A substrate 9 is loaded on a substrate holder 8 provided at a lower portion of the vacuum chamber 1. A collimation plate 6 is provided between the substrate 9 and the Ti target 4 to pass through only the sputtered particles advancing in the vertical direction, and, at its outside, shield plates 5, 7 are provided. The shield plate 5 at the target side is shaped in a wave form and thus its surface area is increased so that nitrogen can be adsorbed as much as possible.

17 Claims, 6 Drawing Sheets

SPUTTERING APPARATUS

This is a Continuation of application Ser. No. 08/543,863 filed Oct. 19, 1995 now abandoned.

FIELD OF THE INVENTION

The present invention relates to a sputtering apparatus and, in particular, to a sputtering apparatus for sputtering in an atmosphere containig nitrogen (N) for forming a titanium nitride (TiN) film.

BACKGROUND OF THE INVENTION

In recent semiconductor devices, a TiN layer is often formed between a semiconductor substrate having circuit elments formed thereon and an aluminum (Al) alloy which is the wiring material. The TiN layer is used as a barrier metal for preventing silicon (Si) of the semiconductor substrate and Al of the Al alloy from diffusing to the Al alloy and the semiconductor substrate respectively so as to protect the circuit element against attack of Al.

Further, in the up-to-date semicondutor device, interconnection holes (contact holes), which are provided at the interlayer insulating film between the circuit elements and the wiring, have become fine and yet deepened, and it becomes difficult to bury the Al alloy formed by the sputtering process into the contact holes. Thus, a process of filling the contact holes with tungsten (W) grown according to the low pressure chemical vapor deposition process (LPCVD process) having excellent step coverage has come to be adopted.

However, the W film is easy to peel off because of its low adhesive strength against the insulating film. Further, if W is directly grown on Si, then $WF_6$, the raw material gas, and Si, the substrate, often react with each other to destroy the circuit elements. Therefore, instead of forming the W film on the substrate directly, TiN film is formed by the sputtering process, and W is grown thereon. In this case, in order to completely prevent destruction of the elements, at least 10 nm of the TiN film is necessary on the bottom of the contact hole. However, if the aspect ratio obtained by dividing the depth value of the contact hole by its diameter value is great, it is difficult to form more than 10 nm of TiN film on the bottom of the contact hole according to the usual sputtering process.

Therefore, in order to improve the coverage of the contact hole, a collimation sputtering process is proposed in, for example, Japanese Patent Application Laid-Open Nos. 1-116070 and 1-184276 etc, in which a plate (collimation plate) which serves as a filter provided with a multiplicity of holes is provided between the sputtering target and the substrate to pass through only the sputter particles incident to the substrate at an angle approximate to a right angle. This collimation sputtering process is gradually put into practical use because a practical growth rate can be obtained by increasing the sputter power to greater than 10 kW in forming the TiN film.

However, by solely increasing the sputter power, it is difficult to grow the TiN film stably at a high speed. Since the TiN film is usually formed by a reactive sputtering process in which the Ti target is sputtered in the atmosphere containing nitrogen, if the sputter power is increased, it is also necessary to increase the flow rate of nitrogen with the result that the surface of the target also becomes nitrided. If TiN is formed on the surface of the target, then the growth rate of the TiN film is reduced to less than one third under the same sputter power as compared with the case in which Ti film is formed by the sputtering process. The collimation sputtering process loses its practicality because the growth rate is further reduced as compared with the usual sputtering process.

In order to solve this problem, there is proposed a process in, for example, Proceedings of 1993 VLSI Multilevel Interconnection Conference pp. 433–435 and pp. 439–441, in which the sputtering is performed so as not to nitride the surface of the target and thus Ti is nitrided on the surface of the substrate to form the TiN film. Further, a similar technical idea is also described in the above Japanese Patent Application Laid-Open No. 1-116070.

However, in this process, it is necessary to exactly control the flow rate of inert Ar and N.

Figure 1:
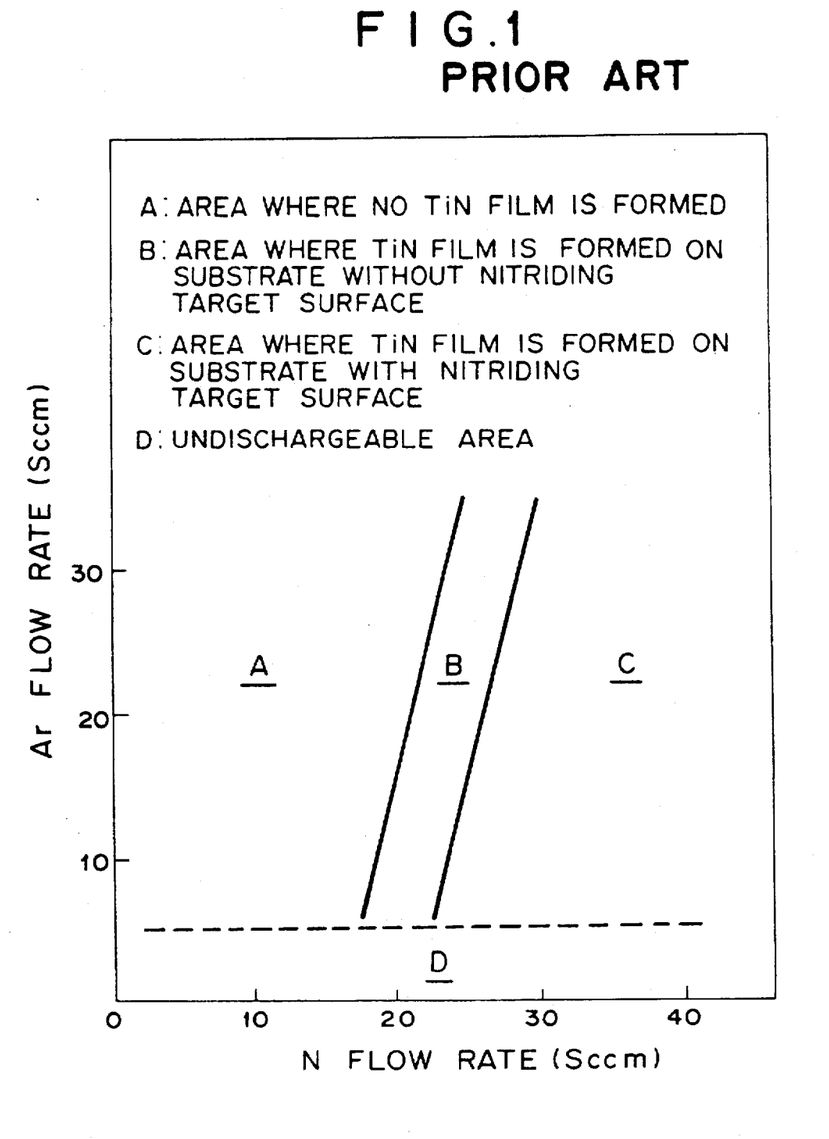
FIG. 1 is a graph illustrating a relationship between N and Ar flow rates and a state in which the TiN film is formed in the conventional sputtering apparatus.

FIG. 1 is a graph illustrating the film forming condition in which the flow rate of Ar and N is changed when the collimation sputtering is conducted under the sputter power of 10 kW using a target having a diameter of 300 mm.

In this case, the thickness of the collimation plate is 10 mm, and the diameter of the hole which is provided through the collimation plate is also 10 mm. In the area where the N flow rate is small, the Ti film is substantially formed on the substrate without forming TiN film (area A) while, in the area where the N flow rate is great, the TiN film is formed on the substrate and also on the surface of the target (area C). Therefore, in the area C, the growth rate of the TiN film on the substrate becomes small because the target surface is also nitrided to form TiN film.

As can be seen from FIG. 1, the range of N flow rate in the area B, where TiN film can be formed by nitriding Ti only on the substrate surface without nitriding the surface of the Ti target, should be as narrow as about 5 sccm or less. The absolute value of the N flow rate can be changed according to the sputtering condition while the range width of the N flow rate for this process is narrow without being changed substantially. Therefore, TiN film cannot often be formed, or the growth rate can be changed and the film thickness can differ greatly between the substrates, due to a slight difference in N flow rate, pressure, substrate temperature or the like during sputtering.

Generally, generally, the TiN film is not only formed on the substrate, but TiN film is also formed on a shield plate (intended for preventing Ti and TiN films from being formed on the inner wall of the chamber) provided around the collimation plate or substrate to thereby consume N. If, in compensation, the N flow rate is increased so that sufficient N is supplied to the subsrate surface, then, as described above, TiN film is easily formed on the target surface with the result that the growth rate is reduced. Further, if the TiN film is formed on the shield plate, TiN becomes easy to grow in the form of particles and sticks to the subsrate as such during sputtering to degrade the quality of the TiN film.

On the other hand, the Ti film is formed by stopping N supply after the TiN film is formed in order to inhibit ocurrence of the particles. However, even if such a method is used, it is difficult to suppress the ocurrence of the particles completely and, in this case, the target can be consumed.

SUMMARY OF THE INVENTION

The present invention was made in view of the foregoing circumstances. Its first object is to form the TiN film on the substrate at a high speed and stably, its second object is to prevent the possible dispersion of the thickness in wafers or lots, and its third object is to form a highly reliable TiN film.

In order to achieve the foregoing objects, according to the present invention, there is provided a sputtering apparatus adapted for forming a TiN film, comprising a vacuuum container, a target retainer member disposed at one side of the vacuum container, a substrate holder disposed at the other side of the vacuum container, a filter disposed between the target retainer member and the substrate holder for passing through only the sputtered partilces advancing in a direction close to the normal direction of a substrate which is secured to the substrate holder, a first shield plate disposed at the substrate holder side of the filter and covering the outer peripheral portion of the filter, and a second shield plate disposed at the target retainer member side of the filter and covering the outer peripheral portion of the filter, wherein, (1) the second shield plate is subjected to a process for increasing an effective surface area, (2) the first shield plate is provided with a heater means, and/or (3) the substrate holder is provided with for a means for cooling the substrate. Preferably, a first space surrounded by the vacuum container, the first shield plate and the filter communicates with a second space at the target retainer member side only via holes of the filter, and a gas inlet is open to the first space to introduce thereto a reactive gas.

According to the present invention, since, in the coolimation sputtering process, the effective surface area of the shield plate disposed between the Ti target and the filter or collimation plate is made great, for example, by making the shield plate take the wave form, the N gas trying to flow toward the Ti target is adsorbed to the shield plate and is consumed to nitride the Ti film being deposited thereon, and even if a large amount of N is flown, nitriding of the surface of the Ti target can be suppressed.

Thus, the range of N flow rate by which the TiN film can be deposited on the substrate without nitriding the Ti target can be increased about three times as compared with the conventional sputtering apparatus. In consequence, the apparatus becomes unlikely to undergo the effect of the chnages of flow rate or pressure, and the TiN film can be formed stably and at a high speed. Further, it becomes possible to form the TiN film without generating the differences in the film thickness and quality among wafers or lots.

Further, if any means for heating the shield plate about the substrate or collimation plate or any means for cooling the substrate is adopted, N becomes easy to be adsorbed to the substrate while becoming difficult to be adsorbed to the shield plate or the collimation plate. Therefore, even if the N flow rate is lowered, the forming speed of the TiN film on the substrate can be maintained to above the standard. In this connection, if a means for increasing the surface area of the shield plate at the target side is simultaneously adopted, then a further great effect can be achieved.

Still further, since the Ti film which has good adhesion and small stress as compared with the TiN film, is formed on the shield plate or collimation plate, the danger that the film is peeled off into particles becomes small. In consequence, degradation of the film quality through adhesion of the particles can be avoided, and since the collimation plate and the shield plate are replaced less often, the amount of materials and the number of man-hours can be decreased in favor of reduction of the cost. Further, in the conventional technique, in order to make the particles difficult to be formed, the Ti film was formed after the TiN film was formed. However in the present invention, this process becomes unnecessary, the throughput can be improved and the number of substrates which can be processed by a single target can be increased.

DESCRIPTION OF THE PREFERRED EMBODIMENTS

Next, some specific embodiments of the present invention are described with reference to the accompanying drawings.

Figure 2:
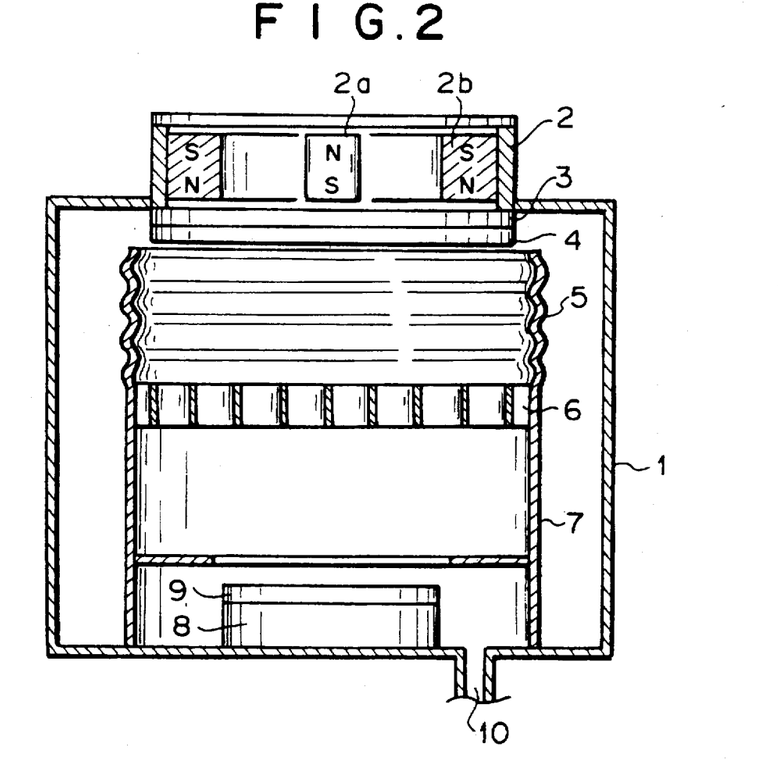
FIG. 2 is a schematic view of the arrangement of the sputtering apparatus according to a first embodiment of the present invention.

FIG. 2 is a schematic view of the arrangement of a sputtering apparatus according to a first embodiment of the present invention. A well-known planar magnetron sputtering electrode 2 is attached to a vacuum chamber 1. A disc-shaped magnet 2a is disposed at the center of the magnetron sputterng electrode 2, and a doughnut-shaped or ring-shaped magnet 2b is disposed thereabout. As shown in FIG. 2, an opposite polarity is each applied to the disc-shaped magnet 2a and the doughnut-shaped magnet 2b. A Ti target 4 is attached to the magnetron sputtering electrode 2 via a back plate 3 and, though not shown, a DC power supply is connected to the Ti target 4.

A Si substrate 9 is attached to a substrate holder 8, and a 10 mm thick collimation plate 6 provided with a multiplicity of holes each having a diameter of 10 mm is disposed between the Ti target 4 and the substrate 9. At the outside of the collimation plate 6, shield plates 5, 7 are disposed to prevent a film forming on the wall of the vacuum chamber 1. The shield plate 5 extending from the outer periphery of the collimation plate 6 toward the Ti target 4 is arranged in the form of a wave in which the crest and the valley alternately appear relative to a vertical direction, so that its surface area is increased. The wavelength of the wave is set to 5 mm. Further, the distance between the Ti target 4 and the collimation plate 6 and the distance between the collimation plate 6 and the substrate 9 are each set to 50 mm.

The shield plate 7 extends from the outer periphery of the collimation plate 6 toward the substrate to the bottom of the vacuum chamber 1, so that a space surrounding the substrate 9 communicates with a space at the side of the target only via the holes of the collimation plate 6. At the bottom of the vacuum chamber 1, a gas inlet 10 is provided to supply nitrogen, a reaction gas, into the space surrounding the substrate 9.

Next, a method of forming a TiN film on the substrate 9 by using a sputtering apparatus according to the present embodiment is described.

20 Sccm of Ar and N are each introduced from the gas inlet 10 to keep the pressure within the vacuum chamber 1 to about 2 mTorr. Next, a negative voltage is applied to the Ti target 4 by means of the DC power supply. The applied power is set to 8 to 10 kW when the Ti target 4 is disc-shaped having a diameter of 300 mm. Discharging is initiated by application of this power, and formation of the film is initiated by sputtering.

The target surface is constantly held to Ti because, the applied power is great relative to the size of the Ti target 4, and the surface of the Ti target 4 is sputtered earlier than when nitrided by N and because, the amount of N is small as compared with that of the Ti particles which are sputtered to jump out, said N is consumed in order to nitride the Ti film deposited on the substrate 9 or the shield plates 5, 7.

In the conventional sputtering apparatus, since a shield plate corresponding to the plate 5 of FIG. 2 is normally cylindrical form and does not have the wave form, its surface area is relatively small, and if the N gas flows more than 20 sccm, for example 30 sccm, then it becomes excessive, and the surface of the Ti target 4 is nitrided to form TiN which reduces the sputtering speed. However, in this embodiment of the present invention, since the shield plate 5 is shape with a wave form so that its surface area is made great, the probability of adsorption of N is increased, and N consumed for nitriding of the Ti film deposited on the shield plate 5 is increased, and even if N as much as 30 sccm is introduced, the surface of the Ti target 4 is not nitrided so that the deposition of the TiN film on the substrate 9 continues at high speed.

Further, in the apparatus of this embodiment, since a spatial area around the substrate 9 and a spatial area around the Ti target 4 are interconnected only via the holes of the collimation plate 6 and the N gas is introduced to the area around the substrate 9, the N gas introduced into the vacuum chamber 1 is nearly all consumed in order to nitride Ti formed on the substrate 9, the shield plate 7 and the collimation plate 6, so that the N gas flowing to the shield plate 5 and the Ti target 4 is slight. Since much of the N gas flowing to the area around the Ti target 4 is consumed in order to nitride the Ti film formed on the shield plate 5, nitriding of the surface of the Ti target 4 is suppressed.

Figure 3:
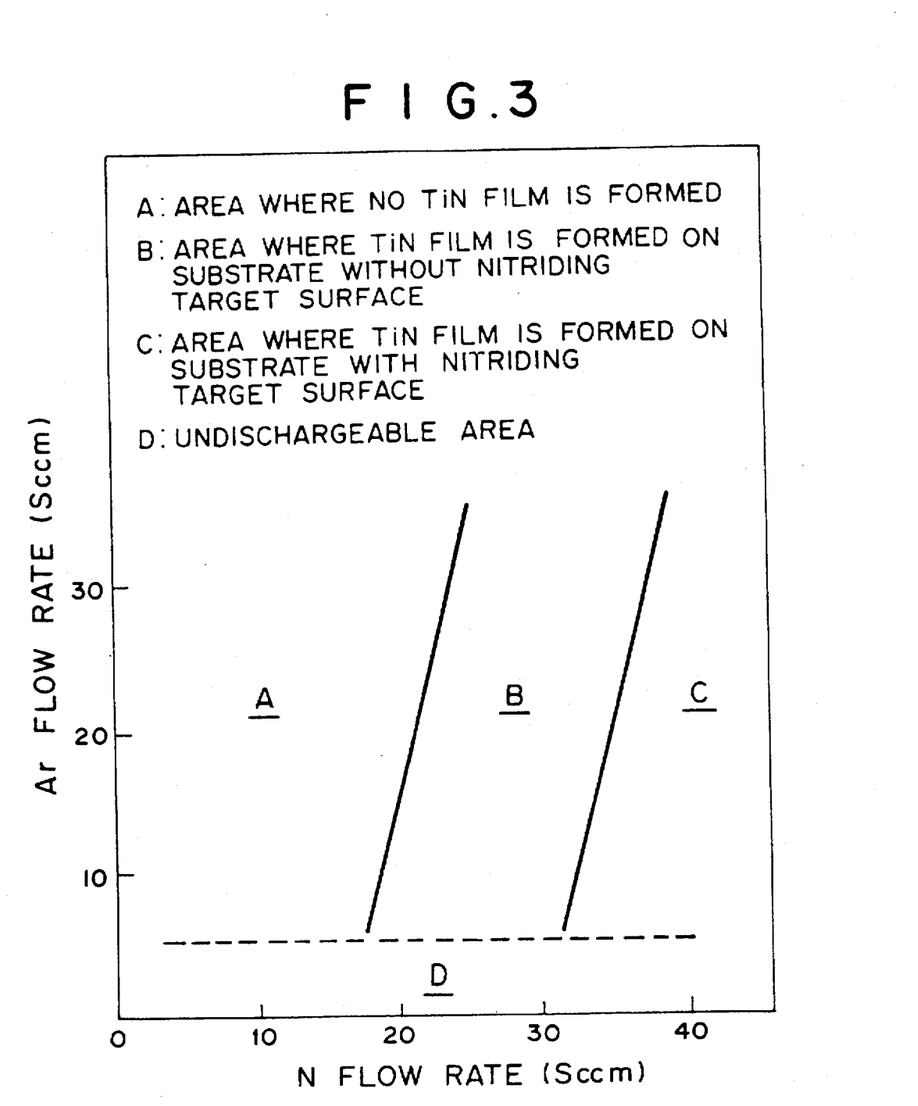
FIG. 3 is a graph for explaining the effect achieved by the first embodiment of the present invention and for illustrating the N and Ar flow rates and the state in which the TiN film is formed.

FIG. 3 is a graph illustrating how the TiN film is formed when the flow rate of N and Ar is changed in this embodiment. As shown therein, the area A where no TiN film is formed is almost the same as in the conventional case of FIG. 1, but the area B where the TiN film is formed on the substrate without nitriding the target surface is about three times as wide. Therefore, this embodiment allows a high speed and stable deposition of the TiN film on the substrate and suppresses dispersion of the film thickness or quality among wafers or small lots.

Figure 4:
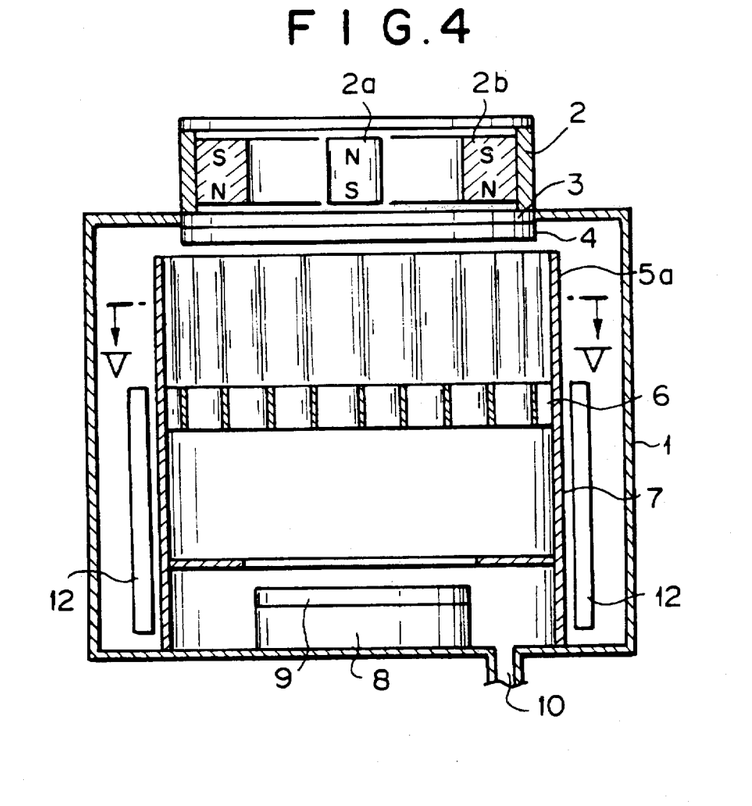
FIG. 4 is a schematic view illustrating the arrangement of the sputtering apparatus according to a second embodiment of the present invention.

FIG. 4 is a schematic view of the arrangement of the sputtering apparatus according to a second embodiment of the present invention, in which the same reference numerals are each assigned to the equivalent portions as those of the first embodiment to omit the repeated description.

Figure 5:
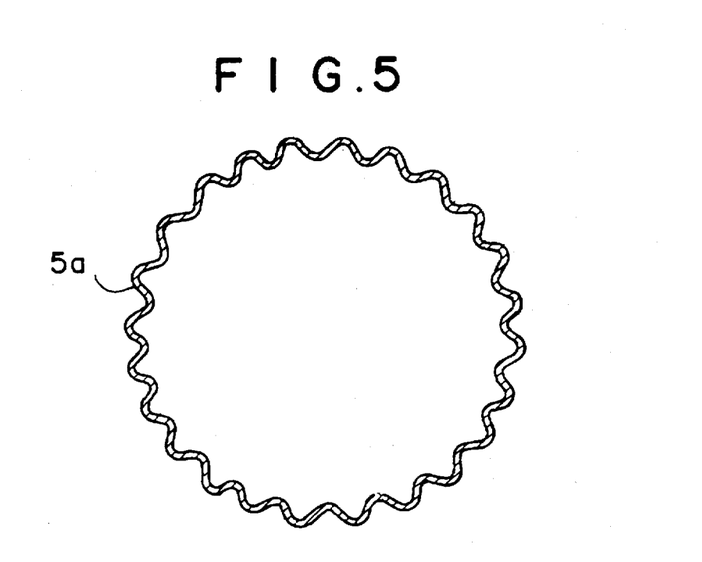
FIG. 5 is a cross-sectional view of the shield plate of the second embodiment taken along line V—V of FIG. 4.

In this embodiment, a shield plate 5a is used, which differs from the shield plate 5 of the first embodiment. In the shield plate 5a, the wave form is formed so that the crest and valley run vertically, namely, as shown in FIG. 5, the crest and valley of the wave alternately appear relative to a circumferential direction.

In the shield plate 5 of the first embodiment, there are areas of surface shadowed down from the Ti target, where since the Ti film is practically not formed, N is not consumed.

However, in the shield plate 5a of the second embodiment, since there is no area shadowed down from the Ti target 4 and the Ti film is formed over the entire surface of the shield plate 5a to consume N well, it becomes difficult to nitride the surface of the Ti target 4 even with the N flow rate greater than that for the shield plate 5. Therefore, the range of the N flow rate which allows deposition of the TiN film on the substrate 9 without nitriding the surface of the target 4 can be widened. The shield plate 5a can be used in the first embodiment.

In the second embodiment, a multiplicity of halogen lamps 12 are disposed about the collimation plate 6 and the outer periphery of the shield plate 7 at the side of the substrate 9 to heat the plates 6 and 7.

The TiN film is formed on the substrate 9 using the sputtering apparatus of this embodiment under the similar conditions as with the first embodiment. At this time, the substrate 9 is not heated. The nitrogen gas introduced during sputtering nitrides the Ti film formed on the substrate 9, shield plates 5a, 7 or collimation plate 6 by physical adsorption to form the TiN film. In this process, the higher temperature reduces the probability of adsorption. Consequently, more nitrogen is adsorbed to the non-heated substrate 9, but since the collimation plate 6 and/or the shield plate 7 are heated, they absorb less N, and the TiN film is not formed thereon, but the Ti film is formed. Since the Ti film has an excellent adhesion and is difficult to peel off, only a small amount of particles are generated.

Figure 6A:
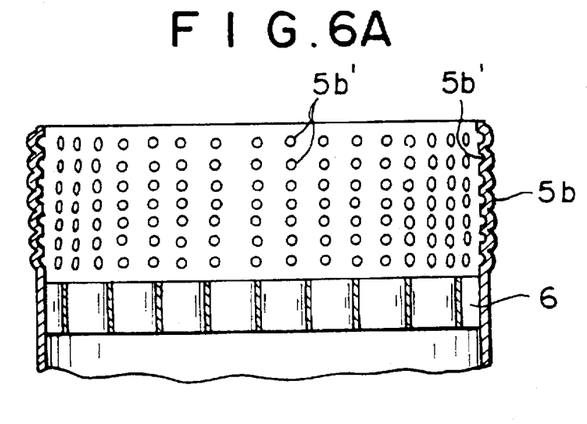
FIGS. 6A, 6B and 6C are views illustrating modified versions of the shield plate used in the sputtering apparatus according to the present invention.
Figure 6B:
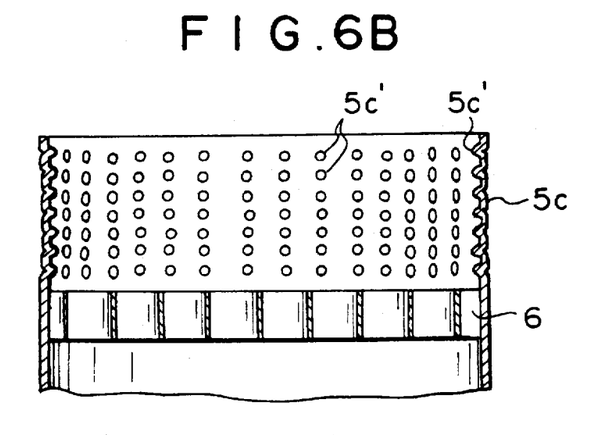
Figure 6C:
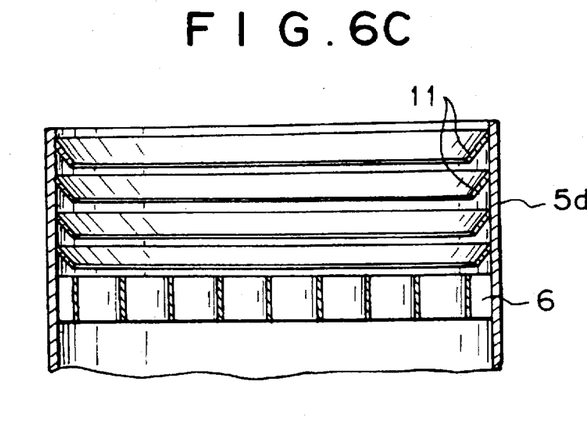

FIGS. 6A, 6B, 6C illustrate further modified versions of the shield plate at the side of the target. Each version is achieved by modifying the shape of the plate 5 of the first embodiment.

In the version of FIG. 6A, a multiplicity of small recesses 5b' are provided on the inner surface of the shield plate 5b to thereby increase the surface area. On the contrary, in the version of FIG. 6B, a multiplicity of small protrusion 5c' are provided on the inner surface of the shield plate 5c to acheve the similar effect. Further, in the version of FIG. 6C, a multiplicity of pent roof members 11 are provieed on the inner surface of the shield plate 5d to increase the surface area.

Figure 7:
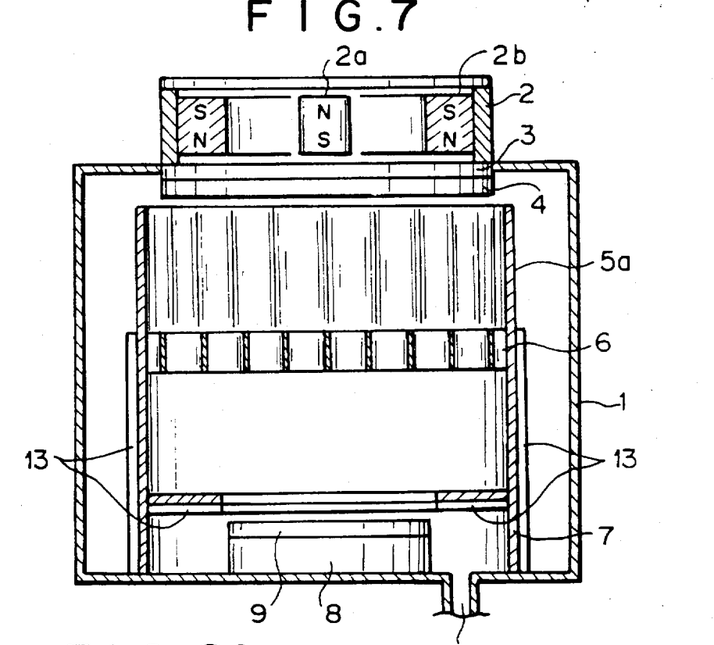
FIG. 7 is a schematic view illustrating the arrangment of the sputtering apparatus according to a third embodiment of the present invention.

FIG. 7 is a view illustrating the schematic arrangement of a third embodiment according to the present invention, in which the same reference numerals are assigned to the similar portions as those of the second embodiment of FIG. 4. This embodiment is also intended for heating the collimation plate 6 or the shield plate 7 as in the second embodiment, but its heating means is different.

In the third embodiment, a ceramic heater 13 is attached to the side of the shield plate 7 where the Ti film is not or is only slightly deposited. In this case, since the ceramic heater 13 contacts the shield plate 7 directly, the temperature of the plates 6 and 7 can be precisely controlled only by the current flowing through the heater without suffering from the effect from the pressure or the like during sputtering. Alternatively, the heater can be buried within the shield plate 7.

Figure 8A:
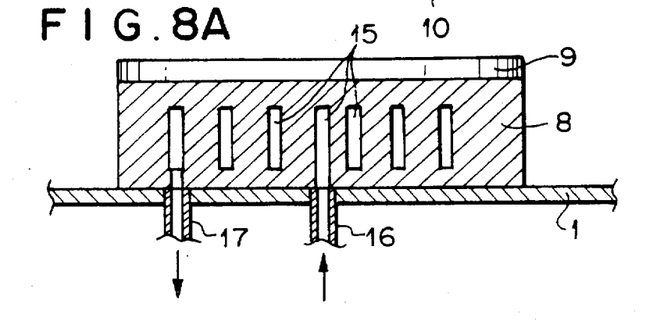
FIGS. 8A and 8B are views illustrating modified versions of the substrate holder used in the sputtering apparatus according to the present invention.
Figure 8B:
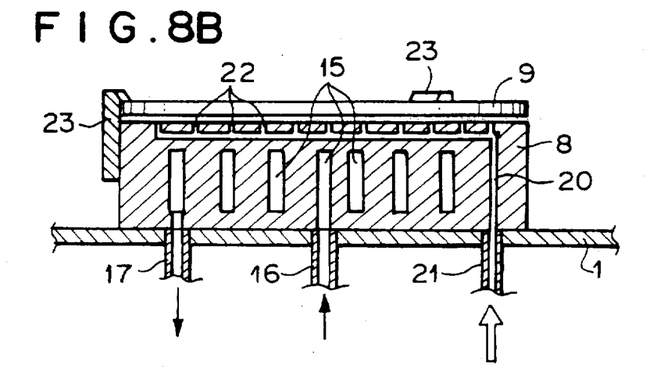

Further, the substrate 9 is preferably positively cooled instead of simply not heating. There are means for cooling the substrate 9, which are shown in FIGS. 8A, 8B. In FIG. 8A, the substrate 9 is firmly secured to the substrate holder 8 by electrostatic adsorption or the like and the substrate holder 8 is cooled with cooling water passing through a passage 15 formed in the substrate holder 8. The passage 15 has a circular form as viewed in the vertical direction. Reference numerals 16, 17 denote an inlet and an outlet of the cooling water, respectively. In FIG. 8B, the substrate holder 8 is cooled with the cooling water passing through the passage 15. Reference numerals 20, 21, 22 denote a passage for a cooling gas, an inlet of a gas and a nozzle formed in the upper surface of the substrate holder 8, respectively. The gas, Ar or N, or both of them, is introduced to the passage 20 via the inlet 21, cooled by the substrate holder 8 which is cooled by the cooling water, and blown from the nozzle 22 toward the rear furface of the substrate 9. The gas blown is introduced into the chamber 1 via a gap formed between the upper surface of the substrate holder 8 and the lower surface of the substrate 9 which is held by means of a clamp member 23.

The number of foreign substances which adhered to a substrate 9 having a diameter of 6 inch is shown in the following Table 1 for the cases in which, with the substrate 9 held at the room temperature, sputtering was conducted without heating the plate 7 and with heating the plate 7 to 200° C. and 400° C. The foreign substances include ones having the size of above 0.3 μm. The number of foreign substances was obtained by forming the TiN films on 100 substrates, measuring the number of the foreign substances on each 10th substrate and averaging the same.

TABLE 1

| Temperature of Shield Plate | Number of Foreign Substances |
|---|---|
| Room Temperatue | 120 |
| 200° C. | 78 |
| 400° C. | 34 |

If the shield plate indicates the room temperature, the TiN film is formed on the plate as well as on the substrate, and as the number of the sputtered substrate is increased, TiN becomes easy to adhere to the substrate in the form of particles, so that the number of foreign substances is also increased. On the other hand, if the plate is heated to about 200° C., then the number of foreign substances is reduced because, though the TiN film is more or less formed around the gas inlet, the TiN film is not formed on the other surface. Further, if the plate is heated up to 400° C., since the TiN film is practically not formed on the plate, the number of foreign substances on the substrate is further reduced.

Further, when the substrate is cooled, if the temperature difference between the substrate and the plate 7 is similar, a similar effect was obtained. Preferably, the temperature difference is more than 200° C.

What is claimed is:

1. A sputtering apparatus for use with a substrate comprising:

a vacuum container;

a target retainer member disposed at one side of said vacuum container;

a target comprising titanium (Ti), attached to said target retainer member inside said vacuum container, for producing sputtered particles;

a substrate holder disposed at a second side of said vacuum container;

a filter disposed inside said vacuum container between said target and said substrate holder, wherein sputtered particles advancing in a direction substantially parallel to the normal direction of said substrate which is secured to said substrate holder are allowed to pass said filter;

a first shield plate disposed at a substrate holder side of said filter and covering an outer peripheral portion of said filter;

a second shield plate disposed at a target side of said filter and covering the outer peripheral portion of said filter;

means for increasing an effective surface area of said second shield plate;

a first space surrounded by said vacuum container, said first shield plate and said filter;

a second space communicating with said first space via said filter, wherein said target is positioned in said second space; and a gas inlet open to said first space for introducing a reactive gas comprising nitrogen (N) into said first space, wherein a first titanium nitride (TiN) film is deposited on said substrate by a reactive sputtering process of said target which forms said sputtered particles which pass said filter and combine with said nitrogen in said first space, and said means for increasing an effective surface area being further for suppressing nitriding of said target by allowing said nitrogen to combine with said titanium and form a second titanium nitride film on said second shield plate, wherein an effective area of said first shield plate is differentiated from said effective surface area of said second shield plate by being devoid of said means for increasing an effective surface area, wherein adsorption of said nitrogen by said first shield plate is suppressed to allow the sputtered particles to be combined with said nitrogen in said first space.

2. A sputtering apparatus as set forth in claim 1, wherein said means for increasing said effective surface area comprises said second shield plate having a waveform shape.

3. A sputtering apparatus as set forth in claim 1, wherein said means for increasing said effective surface area comprises said second shield plate having an irregular shape.

4. A sputtering apparatus as set forth in claim 1, wherein said means for increasing said effective surface area comprises a plurality of pent roof members connected to said second shield plate.

5. A sputtering apparatus for use with a substrate comprising:

a vacuum container;

a target retainer member disposed at one side of said vacuum container;

a target comprising titanium (Ti), attached to said target retainer member inside said vacuum container, for producing sputtered particles;

a substrate holder disposed at a second side of said vacuum container;

a filter disposed inside said vacuum container between said target and said substrate holder, wherein sputtered particles advancing in a direction substantially parallel to the normal direction of said substrate which is secured to said substrate holder are allowed to pass said filter;

a first shield plate disposed at a substrate holder side of said filter and covering an outer peripheral portion of said filter;

a second shield plate disposed at a target side of said filter and covering the outer peripheral portion of said filter;

a first space surrounded by said vacuum container, said first shield plate and said filter;

a second space communicating with said first space via said filter, wherein said target is positioned in said second space;

a gas inlet open to said first space for introducing a reactive gas comprising nitrogen (N) into said first space;

means for heating said first shield plate; and means for cooling said substrate, wherein a titanium nitride (TiN) film is deposited on said substrate by a reactive sputtering process of said target which forms said sputtered particles which pass said filter and combine with said nitrogen in said first space, and said means for heating and said means for cooling being further for increasing adsorption of said nitrogen by said substrate and for suppressing adsorption of said nitrogen by said first shield plate, wherein said means for heating said first shield plate and said means for cooling said substrate generate a temperature difference between said first shield plate and said substrate, wherein adsorption of said nitrogen by said first shield plate is suppressed to allow the sputtered particles to be combined with said nitrogen in said first space.

6. A sputtering apparatus as set forth in claim 5, wherein said means for cooling said substrate comprises means for blowing a gas to a rear surface of said substrate.

7. A sputtering apparatus as set forth in claim 1, further comprising means for heating said first shield plate and means for cooling said substrate.

8. A sputtering apparatus for use with a substrate comprising:

a vacuum container;

a target retainer member disposed at a first side of said vacuum container;

a target comprising titanium (Ti), attached to said target retainer member inside said vacuum container, for producing sputtered particles;

a substrate holder disposed at a second side of said vacuum container;

a filter disposed inside said vacuum container between said target and said substrate holder, wherein sputtered particles advancing in a direction substantially parallel to the normal direction of said substrate which is secured to said substrate holder are allowed to pass said filter;

a first shield plate disposed at a substrate holder side of said filter and covering an outer peripheral portion of said filter, wherein a first titanium nitride (TiN) film is deposited on said substrate by a reactive sputtering process of said target which forms said sputtered particles which pass said filter and combine with nitrogen (N) introduced into said vacuum container at said substrate holder side of said filter; and a second shield plate disposed at a target side of said filter and covering the outer peripheral portion of said filter, said second shield plate having an inner surface with an effective area greater than that of an inner surface of said first shield plate such that said second shield plate suppresses nitriding of said target by allowing said nitrogen in the vacuum container to be consumed thereby to nitride said titanium at said target side of said filter and form a second titanium nitride film on said second shield plate, wherein an effective area of an inner surface of said first shield plate is differentiated from said effective area of inner surface of said second shield plate, wherein adsorption of said nitrogen by said first shield plate is suppressed to allow the sputtered particles to be combined with said nitrogen.

9. A sputtering apparatus as set forth in claim 8, further comprising:

a first space surrounded by said vacuum container, said first shield plate and said filter;

a second space communicating with said first space via said filter, wherein said target is positioned in said second space; and a gas inlet open to said first space for introducing a reactive gas comprising nitrogen into said first space.

10. A sputtering apparatus as set forth in claim 8, wherein an inner surface of said second shield plate has a waveform shape.

11. A sputtering apparatus as set forth in claim 8, wherein an inner surface of said second shield plate has an irregular shape.

12. A sputtering apparatus as set forth in claim 8, wherein an inner surface of said second shield plate includes a plurality of roof members.

13. A sputtering apparatus as set forth in claim 8, further comprising means for heating said first shield plate and means for cooling said substrate.

14. A sputtering apparatus as set forth in claim 13, wherein said means for cooling said substrate comprises means for blowing a gas to a rear surface of said substrate, said gas having a temperature less than that of said substrate.

15. A sputtering apparatus as set forth in claim 1, wherein an inner surface of said second shield plate has a surface area greater than that of an inner surface of said first shield plate.

16. A sputtering apparatus as set forth in claim 5, wherein an inner surface of said second shield plate has a surface area greater than that of an inner surface of said first shield plate.

17. A sputtering apparatus, comprising a vacuum chamber having a top side and a bottom side;

a shield positioned coaxial inside of said vacuum chamber;

a sputtering target holder located at said top side of said vacuum chamber;

a substrate holder located at said bottom side of said vacuum chamber; and a collimator positioned in said shield between said sputtering target holder and said substrate holder, said collimator dividing said shield into an upper shield portion and a lower shield portion, wherein said upper shield portion comprises a wavy interior surface.

* * * * *